(12) United States Patent
Di Stefano (10) Patent No.: US 6,771,084 B2
(45) Date of Patent: Aug. 3, 2004

(54) SINGLE-SIDED COMPLIANT PROBE APPARATUS

(75) Inventor: Thomas H. Di Stefano, Monte Sereno, CA (US)

(73) Assignee: Decision Track LLC, Monte Cereno, CA (US)

( * ) Notice: Subject to any disclaimer, the term of this patent is extended or adjusted under 35 U.S.C. 154(b) by 0 days.

(21) Appl. No.: 10/198,974

(22) Filed: Jul. 19, 2002

(65) Prior Publication Data

US 2002/0180473 A1 Dec. 5, 2002

Related U.S. Application Data

(63) Continuation-in-part of application No. 09/564,982, filed on May 2, 2000, now Pat. No. 6,426,638.

(51) Int. Cl.⁷ .............................................. G01R 31/02
(52) U.S. Cl. ...................................... 324/754; 324/762
(58) Field of Search ................................ 324/754, 765, 324/761–762, 158.1, 758; 439/66; 29/593, 825, 885; 257/690

(56) References Cited

U.S. PATENT DOCUMENTS

| | | |
|---|---|---|
| 3,795,037 A | 3/1974 | Luttmer |
| 3,806,801 A | 4/1974 | Bove |
| 4,189,825 A | 2/1980 | Robillard et al. |
| 4,312,117 A | 1/1982 | Robillard et al. |
| 4,585,991 A | 4/1986 | Reid et al. |
| 4,912,399 A | 3/1990 | Greub et al. |
| 4,916,002 A | 4/1990 | Carver |
| 4,961,052 A | 10/1990 | Tada et al. |
| 5,012,187 A | 4/1991 | Littlebury |
| 5,055,780 A | 10/1991 | Takagi et al. |
| 5,073,117 A | 12/1991 | Malhi et al. |
| 5,172,050 A | 12/1992 | Swapp |
| 5,225,771 A | 7/1993 | Leedy |
| 5,513,430 A | 5/1996 | Yanof |
| 5,531,022 A | 7/1996 | Beaman et al. |
| 5,559,444 A | 9/1996 | Farnsworth et al. |
| 5,611,696 A | 3/1997 | Donner et al. |
| 5,841,291 A | 11/1998 | Liu et al. |
| 5,878,486 A | 3/1999 | Eldridge et al. |
| 5,977,787 A | 11/1999 | Das et al. |
| 6,068,669 A | 5/2000 | Farnsworth et al. |
| 6,084,420 A | 7/2000 | Chee |
| 6,202,297 B1 | 3/2001 | Faraci et al. |
| 6,482,013 B2 * | 11/2002 | Eldridge et al. .............. 439/66 |

OTHER PUBLICATIONS

Bassous "Fabrication of Novel Three–Dimensional Microstructures by the Anisotrophic Etching of (100) and (110) Silicon," IEEE Transactions on Electron Devices 25:1178–1185 (1978).
Greene et al. "Flexible Contact Probe," IBM Technical Disclosure Bulletin 15:1513 (1972).
Leslie et al. "Membrane Probe Card technology (The Future for High Performance Wafer Test)," IEEE International Test Conference, pp. 601–607 (1988).
Kiewit "Microtool Fabrication by Etch Pit Replication," Rev. Sci. Instrum. 44:17–18 (1973).

* cited by examiner

Primary Examiner—Kamand Cuneo
Assistant Examiner—Paresh Patel
(74) Attorney, Agent, or Firm—Townsend and Townsend and Crew LLP; Kenneth R. Allen

(57) ABSTRACT

A small single-sided compliant probe is provided that includes a conductive tip, which is positioned on a supporting surface in a manner that allows a tip on the probe to move flexibly with respect to the supporting surface in close proximity to adjacent probes in an array. The probe tip moves vertically in response to the force of a mating contact pad as it biased against the tip. Mechanical compliance of the probe allows electrical contact to be made reliably between the probe and a corresponding contact pad on a microelectronic device, where the mechanical compliance accommodates variations in height of the contact pad.

14 Claims, 9 Drawing Sheets

FIGURE 1

*PRIOR ART*

FIGURE 2A

*PRIOR ART*

FIGURE 2B

*PRIOR ART*

SINGLE-SIDED COMPLIANT PROBE APPARATUS

BACKGROUND OF THE INVENTION

This invention relates to burn-in and test of microelectronic devices, specifically to contact assemblies used for connecting electrical signals to integrated circuits during burn-in and test of individual chips and of full wafers.

Microelectronic devices are subjected to a series of test procedures during the manufacturing process in order to verify functionality and reliability. The testing procedures conventionally include wafer probe testing, in which microelectronic device chips are tested to determine operation of each chip before it is diced from the wafer and packaged. Probe cards built of long cantilever wires are used to test one or several chips at a time while on the wafer.

Typically, not all chips on a wafer are found to be operable in the wafer probe test, resulting in a yield of less than 100% good devices. The wafer is diced into individual chips, and the good chips are then assembled into packages. The packaged devices are dynamically burned-in by loading them into sockets on burn-in boards and electrically operating them at a temperature of from 125° C. to 150° C. for a burn-in period of 8 to 72 hours in order to induce any defective devices to fail. Burn-in accelerates failure mechanisms that cause infant mortality or early failure of the devices, and allows these defective devices to be weeded out by a functional electrical test before they are used commercially.

A full functional test is done on packaged devices, which are operated at various speeds in order to categorize each by maximum speed of operation. Testing discrete packaged devices also permits elimination of any devices that failed during the burn-in process. Burn-in and test of packaged devices is accomplished by means of sockets specially suited to the burn-in conditions and to high speed testing respectively. Conventional manufacturing processes are expensive and time consuming because of a repeated handling and testing of individual discrete devices through a lengthy set of steps that adds weeks to the total manufacturing time for the device.

A considerable advantage in cost and in process time can be obtained by burn-in and test of the wafer before it is diced into discrete devices. Additional savings can be obtained by fabricating chip size packages on each device on a wafer before the wafer is diced into discrete devices. A considerable effort has been expended by the semiconductor industry to develop effective methods for wafer level burn-in and test in order to gain benefits of a greatly simplified and shortened process for manufacturing microelectronic devices. In order to reap these benefits, it is necessary to provide means to burn-in and speed test chips before they are diced from the wafer into individual discrete devices.

Conventional cantilever wire probes are not suited to burn-in and speed test of devices on the wafer. Cantilever wire probes are too long and costly to allow simultaneous contact to all of the devices on a wafer, as required for simultaneous burn-in of all of the devices on the wafer. In addition, long cantilever wire probes are not suitable for functional testing of high-speed devices because of a high self and mutual inductance of the long, parallel wires comprising the probes.

A small, high-performance probe that can be made at low cost is required for practical application of wafer burn-in and test procedures. To be useful for wafer burn-in and test, the probes must reliably contact all of the pads on the devices under test while they are on the undiced wafer. Probes for contacting the wafer must provide electrical contact to pads on devices where the pads vary in height on the surface of the wafer. In addition, the probes must break through any oxide layers on the surface of the contact pads in order to make a reliable electrical contact to each pad. Many approaches have been tried to provide a cost-effective and reliable means to probe wafers for burn-in and test, without complete success.

Figure 1:
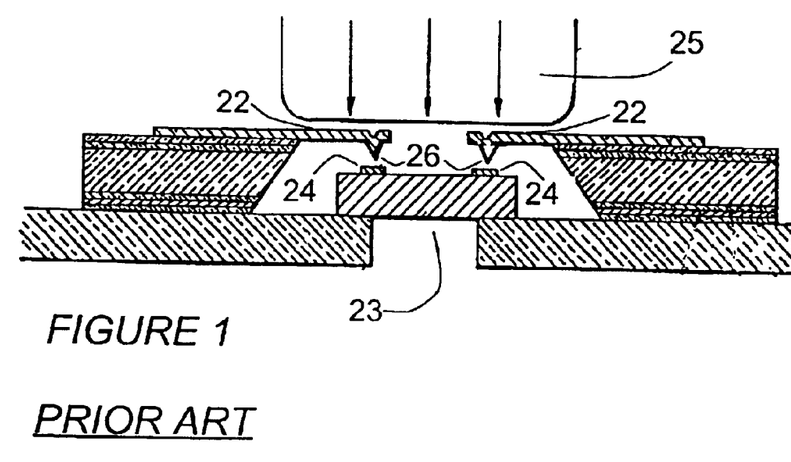
FIG. 1 shows a sectional view of a cantilever probe of the prior art.

A number of attempts have been tried to provide small, vertically compliant probes for contacting reliably the pads on devices on a wafer. According to the invention represented by U.S. Pat. No. 4,189,825, to David R. Robillard and Robert L. Michaels, a cantilever probe is provided for testing integrated circuit devices. In FIG. 1, cantilever 28 supports sharp tips 26 above aluminum contact pads 24 on a chip 23. A compliant member 25 is urged downward to move tips 26 into contact with pads 24. An aluminum oxide layer on pad 24 is broken by sharp tip 26 in order to make electrical contact between tip 24 and the aluminum metal of pad 24. The rigidity of small cantilever beams is generally insufficient to apply the force to a tip that is necessary to cause it to break through an aluminum oxide layer on a contact pad, without an external means of applying force to the cantilever. Cantilever beams of glass, silicon, ceramic material, and tungsten have been tried in various configurations, without success in providing burn-in probes of sufficient force and flexibility.

Figure 2A:
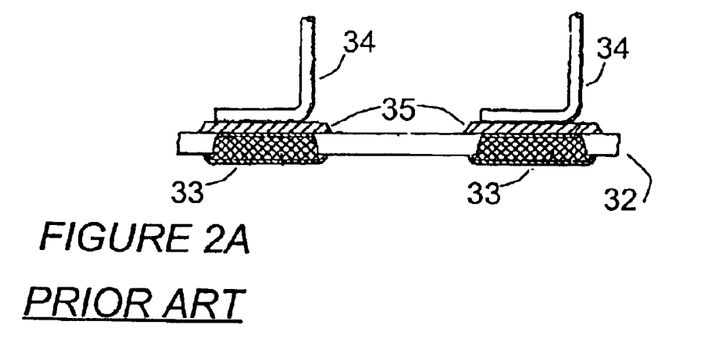
FIGS. 2A and 2B show cross sectional views of flexible membrane probes of the prior art.

A flexible membrane probe shown in FIG. 2A is described in Flexible Contact Probe, IBM Technical Disclosure Bulletin, October 1972, page 1513. A flexible dielectric film 32 includes terminals 33 that are suited to making electrical contact with pads on integrated circuits. Terminals 33 are connected to test electronics by means of flexible wires 34 attached to contact pads 35 on terminals 33. Probes fabricated on a flexible polyimide sheet were described in the Proceedings of the IEEE International Test Conference (1988) by Leslie et al. The flexible sheet allows a limited amount of vertical motion to accommodate variations in height of bond pads on integrated circuits on a wafer under test. Membrane probes such as that described by Leslie et al provide connections to integrated circuit chips for high performance testing. However, dimensional stability of the membrane is not sufficient to allow contacts to pads on a full wafer during a burn-in temperature cycle.

Figure 2B:
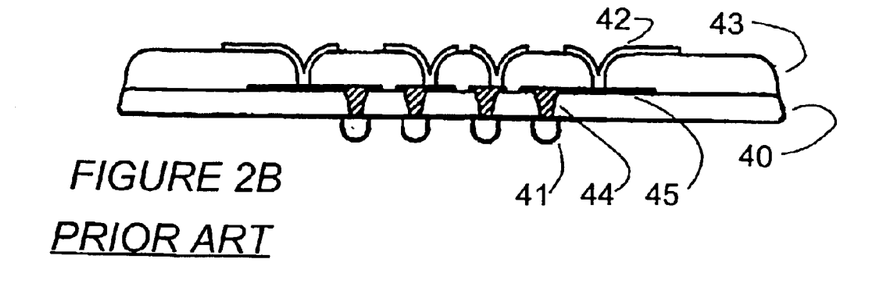

Fabrication of the contacts on a thin silicon dioxide membrane is shown in FIG. 2B as described in U.S. Pat. No. 5,225,771 by Glenn J. Leedy. A silicon dioxide membrane 40 has better dimensional stability than polyimide, thereby somewhat ameliorating the dimensional stability problem of mating contacts to pads on a wafer under test. Probe tips 41 are connected by vias 44 through membrane 40 to circuit traces 45 that are linked to an additional layer of circuitry 42 above a dielectric film 43. Limited vertical compliance of the test probes on silicon dioxide membrane 40 renders use of probe arrays unreliable for use in burn-in of devices on a semiconductor wafer.

Figure 3A:
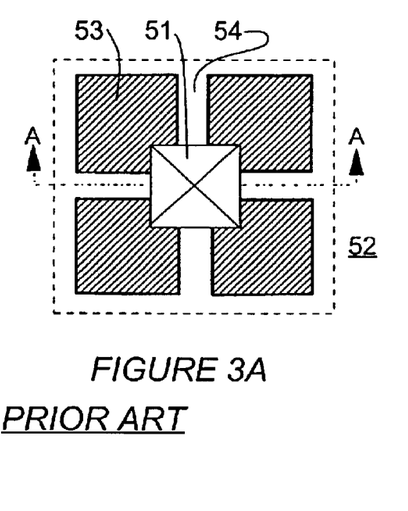
FIG. 3A shows a plan top view of the probe and FIG. 3B shows a sectional view of the probe.
Figure 3B:
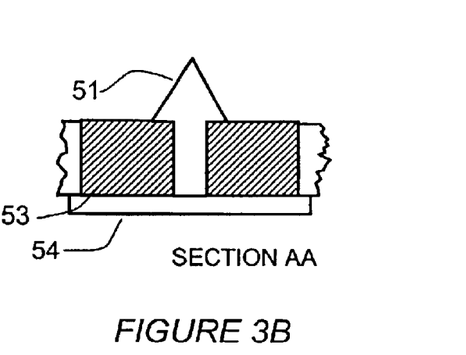

Fabrication of an array of burn-in probes on a semiconductor wafer is described in U.S. Pat. No. 4,585,991, as illustrated in FIGS. 3A and 3B showing a top plan view and a sectional view respectively. Probe 51 is a pyramid attached to semiconductor wafer substrate 52 by arms 54. Material 53 is removed from the semiconductor wafer 52 in order to isolate mechanically the probe 51. A probes as in FIG. 3A provides a limited vertical movement but do not allow space on the substrate for wiring needed to connect an array of probes to test electronics required for dynamic burn-in.

Figure 4A:
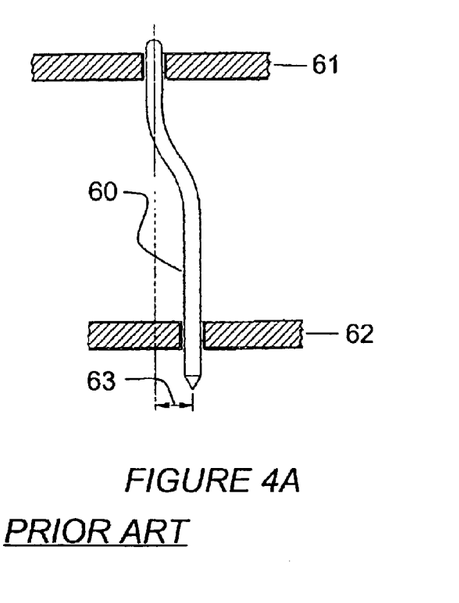
FIGS. 4A to 4C show flexible post probes of the prior art.

An approach to providing flexible probes to device contact pads involves the use of flexible wires or posts to connect test circuitry to pads on a chip. A flexible probe shown in FIG. 4A is described in U.S. Pat. No. 5,977,787 by Gobina Das et al. Probe 60 is a buckling beam, generally described in U.S. Pat. No. 3,806,801 by Ronald Bove. Probe 60 is adapted for use in burn-in of devices on a wafer. Probe 60 is held by guides 61 and 62 that have a coefficient of expansion similar to that of the wafer being tested. Probe 60 is offset by a small distance 63 to provide a definite modality of deflection. Although buckling beams are well suited to testing individual integrated circuit chips, they are too expensive to be used for wafer burn-in where thousands of contacts are required. Further, electrical performance of buckling beam probes is limited because of the length required for adequate flexure of the beam.

Figure 4B:
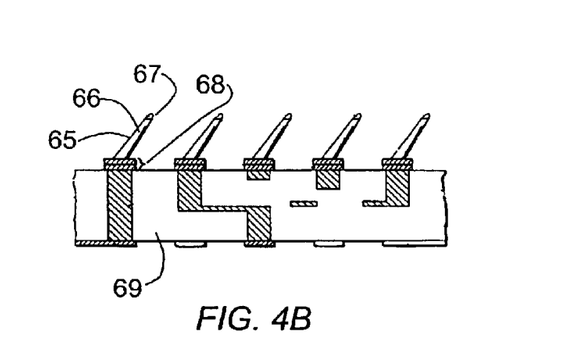

Another approach using flexible posts is shown in FIG. 4B as disclosed in U.S. Pat. No. 5,513,430 by Arnold W. Yanof and William Dauksher. FIG. 4b shows flexible probes in the form of posts 66 that are able to bend in response to force on probe tip 67. Posts 66 are formed at an angle to a substrate 69 in order to allow them to flex vertically in response to a force on tip 67 from mating contact pads. Posts 66 have a taper 65 from the base terminal 68 to tip 67 in order to facilitate flexure.

Figure 4C:
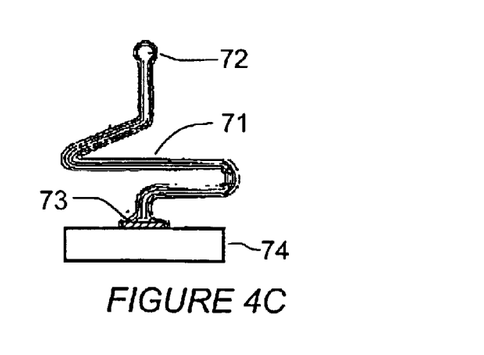

Yet another approach using flexible wires and posts is shown in FIG. 4C as disclosed in U.S. Pat. No. 5,878,486 by Benjamin N. Eldridge, et al. The probe shown in FIG. 4C comprises a probe tip 72 on a spring wire 71 that is bent to a specific shape in order to facilitate flexure. Wire 71 is joined to substrate 74 by a conventional wire bond 73. Probes of the type shown in FIG. 4C require a long spring length to achieve the contact force and compliancy needed for wafer burn-in. Additionally, such probes that use individual wires are too expensive for use in wafer burn-in where many thousands of probes are required for each wafer.

Further approaches to providing flexible probes involve the use of compliant layers interposed between a test head and a device being tested, such that terminals on the test head are electrically connected to mating contact pads on the device. The electrical connector described in U.S. Pat. No. 3,795,037 by Willem Luttmer utilizes flexible conductors embedded in an elastomer material to make connections between mating pairs of conductive lands that are pressed into contact with the top and bottom surfaces of the electrical connector. Many variations of flexible conductors including slanted wires, conductive filled polymers, plated posts and other conductive means in elastomeric material in order to form compliant interposer layers.

The approaches listed above and other attempts have been unsuccessful in providing a high performance probe that allows economical burn-in and speed test of microelectronic devices on a wafer before the wafer is diced into discrete chips.

SUMMARY OF THE INVENTION

In accordance with the present invention, a single-sided compliant probe is provided that includes a conductive tip, which is positioned on a supporting substrate in a manner that allows a tip on the probe to move flexibly with respect to the supporting substrate, while in close proximity to adjacent probes in an array. The probe tip moves vertically in response to the force of a mating contact pad as it is mechanically biased against the tip. Mechanical compliance of the probe allows electrical contact to be made reliably between the probe and a corresponding contact pad on a microelectronic device, where the mechanical compliance accommodates variations in height of the contact pad.

The present invention is useful for making electrical connection to contact pads on microelectronic devices on an undiced wafer in order to burn-in the devices before they are diced into separate chips. Compliant probes according to the invention allow reliable electrical connections to be made simultaneously to all of the contact pads arrayed on the surface of a wafer so that microelectronic devices on the wafer can be burned-in economically. Mechanical compliance of probes in the fixture accommodates variations in height of the contact pads and in the probe tips such that each probe tip remains in contact with its mating contact pad throughout the temperature cycle of the burn-in process.

The present invention also provides an element of an electrical probe card that allows high speed testing of unpackaged microelectronic devices. Small, single-sided compliant probes as taught in this disclosure are used to make temporary connections to corresponding pads on a device in order to apply electrical test signals to that device and to measure electrical signals from that device. The small size of the compliant probe allows high speed electrical signals to be passed to and from the device without losses due to excessive inductance or capacitance associated with wire probes as used in the prior art.

Small, compliant probes as taught in this disclosure are used to make reliable electrical connections to contacts on the device, where the contacts are arranged in an area array. Mechanical compliance allows the tip of each probe to maintain electrical contact with a mating contact on the device notwithstanding variations in the height of contacts on the device both at room temperature and at the operating temperature range of the device.

The present invention also provides a small socket for connecting integrated circuit chips to electrical circuits for purposes of burn-in, test and operation of the chip. The small size of each probe contact in the socket allows high-speed operation of a chip mounted in the socket. Mechanical compliance of the probes as taught in this disclosure enables reliable electrical connections to be made to a rigid chip with minimal or no packaging. Compliant probes according to the present invention allow construction of small, economical sockets for chip scale packages and for flip-chips.

The probe disclosed herein is significantly improved over conventional cantilever probes in that it provides a greater range of compliant motion of the probe tip for any given probe force and probe size. A conventional cantilever probe is limited by the range of motion it provides in response to a given force the elastic limit of the probe material is reached. The maximum mechanical stress in cantilever probes is concentrated on the surface of the cantilever material at the point of flexure. The invention provides a greater range of motion for a given spring material and probe force before it reaches the elastic limit of that material.

The invention increases manufacturing efficiency for microelectronic devices by providing test and burn-in functions reliably at the wafer level, while at the same time reducing the size of the test fixture. The mechanically compliant probe provides a large range of motion relative to the size of the probe. This range of motion is important in making connections to a device with contact pads that are not substantially in the same plane. The compliant probe tip moves flexibly to accommodate differences in the height of mating contact pads while maintaining sufficient force of the probe tip on the contact pad to assure reliable electrical contact therebetween.

A probe tip is disposed on an elongated thin strip of material that is supported rigidly by a rigid post at one end and slidably by a protrusion disposed at a distance from the first end, wherein the tip is located at a predetermined distance from a center line connecting the centers of the rigid post and the protrusion. The probe tip thus supported is able to move compliantly in a vertical direction by torsional and bending flexure of the thin strip of material.

The invention is able to increase manufacturing efficiency for microelectronic devices by performing test and burn-in functions reliably at the wafer level, while at the same time reducing the size of the test fixture.

The invention will be better understood by reference to the following detailed description in conjunction with the accompanying drawings.

BRIEF DESCRIPTION OF THE DRAWINGS

FIGS. 3A and 3B show views of a probe fabricated on a silicon wafer of the prior art where

FIGS. 7A to 7C show an third embodiment of a single-sided compliant probe where

FIGS. 9A and 9B show arrays of single-sided compliant probes where

DESCRIPTION OF SPECIFIC EMBODIMENTS OF THE INVENTION

Figure 5:
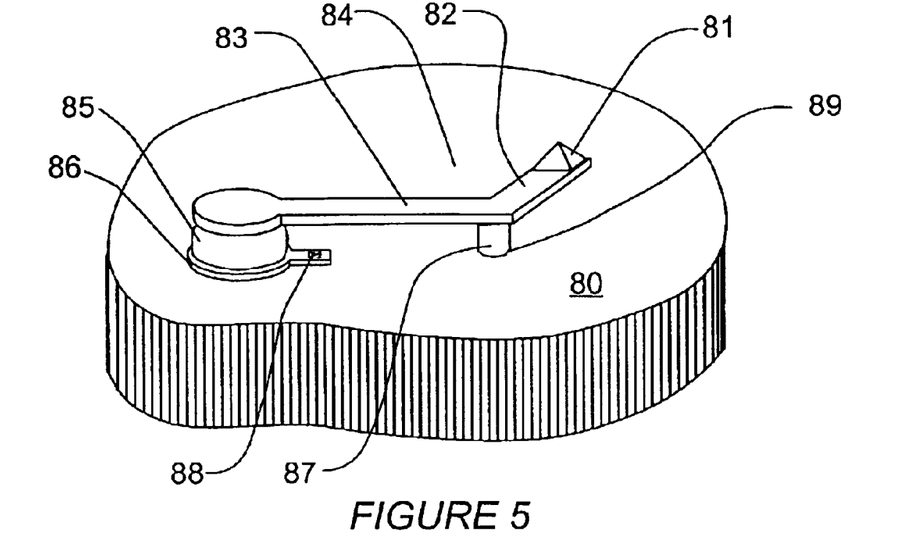
FIG. 5 shows a view of a single-sided compliant probe of a first embodiment in accordance with the present invention.

For a description of specific embodiments, reference is made to FIG. 5 showing a first embodiment of a single-sided compliant probe. A probe is disclosed that allows reliable electrical connection to be made to contact pads on microelectronic devices such as integrated circuits (ICs), flip-chips, passive devices, and chip scale packages. The probe provides flexible vertical motion of probe tip 81 in response to a force on the tip. Thus, as a contact pad is urged into contact with probe tip 81, mechanical compliance of the structure allows the tip to make contact with the mating contact pad at a force sufficient for probe tip 81 to penetrate an insulating oxide film on the pad. Mechanical compliance of the probe accommodates differences in height of the contact pads in a region of the microelectronic device while providing sufficient force on each probe tip to assure a reliable electrical connection between the tip and the corresponding contact pad. Further, mechanical compliance of the pad is necessary to allow the tip to maintain a connection to the corresponding pad during a test or burn-in cycle where thermal expansion may cause mechanical movement of the probe support with respect to the device.

Probe tip 81 is supported on lateral extension arm 82 that is attached to main body 83 of conductive material. Elongated flexible strip 83 is supported at one end by rigid post 85 that is joined to main body 83. Probe tip 81 moves flexibly in response to a force applied vertically to tip 81. Vertical movement of tip 81 depresses arm 82 and torsionally flexes main body 83 which serves as a torsional spring, thereby impressing a restoring force on tip 81. Post 87 supports the end of main body 83 so as to reduce cantilever deflection of main body 83. Post 87 rests on substrate 84 at slideable slidable pivot point 89 (FIG. 5) that allows torsional rotation of the main body 83.

In single-sided compliant probe 80 shown in FIG. 5, post 85 is supported on substrate 84 by pad 86 which is connected electrically to circuit via 88 which is connected in turn to electrical circuitry in substrate 84. By the series of links described above, probe tip 81 is connected electrically to circuits in substrate 84 that operate a device that is connected to the probe. In applications such as burn-in of integrated circuits, substrate 84 is made of a low expansion material in order to achieve dimensional stability over a wide temperature range such as those used in burn-in, where temperature cycles may go from 25° C. to 150° C. or greater.

For operation at high frequencies, the electrical links from probe tip 81 to via contact 88 may be arranged to reduce the inductance of the connection to probe tip 81. The inductive loop may be minimized by locating via 88 under probe tip 81. While via contact 88 cannot always be so ideally located, the distance between probe tip 81 and via contact 88 should be small in those applications that require high frequency operation.

Figure 6:
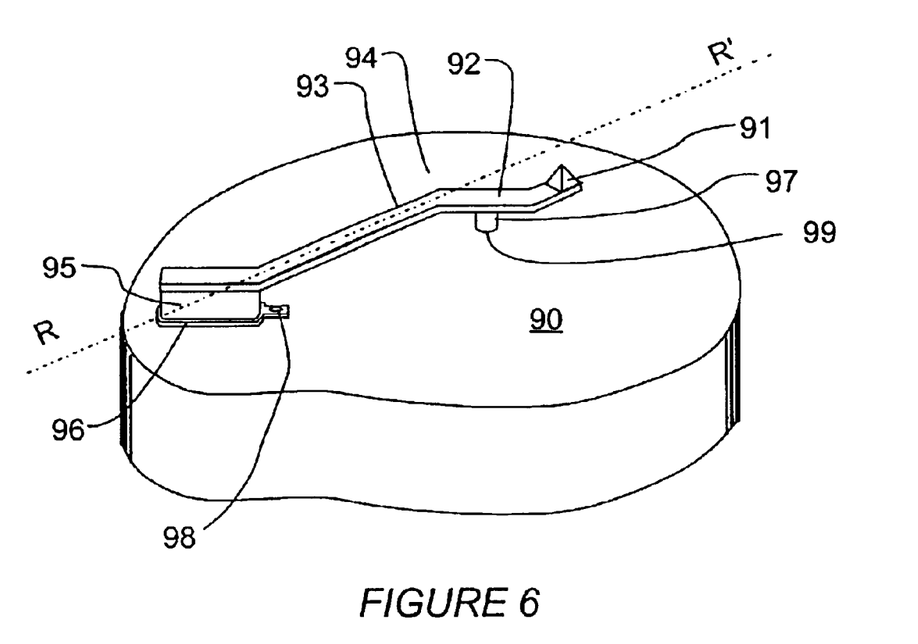
FIG. 6 shows a view of a single-sided compliant probe of a second embodiment in accordance with the present invention.

FIG. 6 shows a second embodiment 90 of a single-sided compliant probe where conductive arm 92 is oriented at an obtuse angle with respect to main body 93. Main body 93 is rigidly attached to elongated post 95, which is supported by pad 96 on rigid substrate 94. The elongated post 95 is oriented at an obtuse angle with respect to main body 93. The obtuse angles of post 95 and arm 92 allow several probes of this design to be assembled adjacently in closely spaced arrays. Electrical connection to tip 91 is made through arm 92, to main body 93, to post 95 to pad 96, and through via 98 to electrical circuits in substrate 94.

As seen in FIG. 6, pivot post 97 supports main body 93 above substrate 94 at slidable pivot 99 so as to allow torsional rotation of main body 93. Probe tip 91 is supported on arm 92 such that the center of probe tip 91 is located at a distance from an imaginary line R–R' between rigid post 95 and pivot post 97. A vertical force on probe tip 91 produces a torsional flexure of main body 93 about an axis represented by line R–R'. Main body 93 acts as a torsional spring which produces a counter force acting to oppose force on tip 91.

Figure 7A:
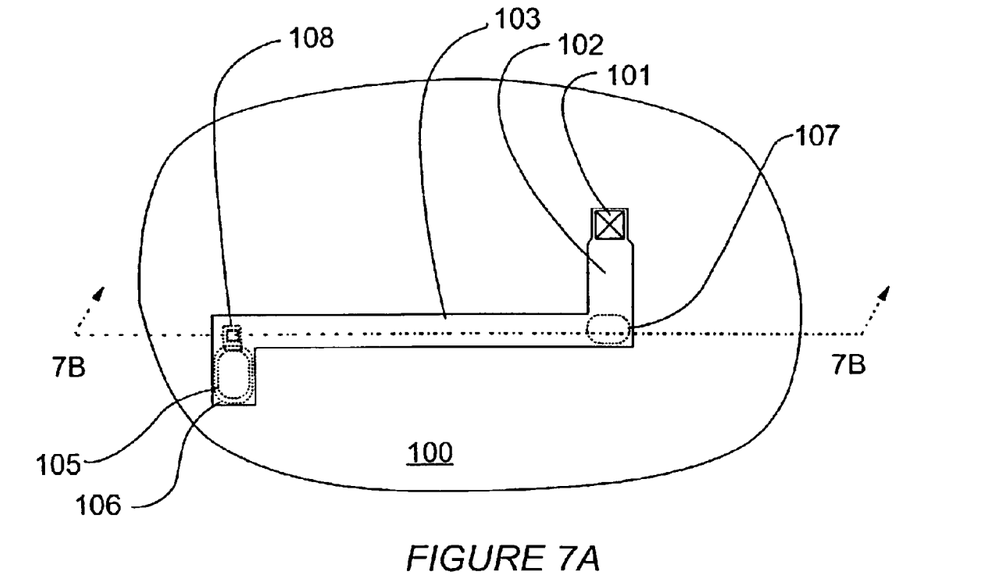
FIG. 7A is a top plan view.

FIG. 7A shows a plan view from above of a third embodiment 100 of the single sided compliant probe. Flexible elongated strip 103 is made of a sheet of metal shaped to include a lateral extension 102 at the end of strip 103. The electrically conductive material of strip 103 is chosen to exhibit high yield strength in order to act as a torsional spring. Metals chosen from the group consisting of beryllium-copper alloys, tungsten, cupro-nickel, molybdenum, nickel, nickel-titanium, nickel-tungsten, stainless steel, titanium, and alloys thereof are suitable for the torsional spring. One suitable metal is beryllium-copper alloy ASTM Spec. No. B534, with yield strength of 550 mega-Pascals. Another suitable metal is titanium alloy Ti, 8 Al, 1 Mo, 1 V, with yield strength of 910 mega-Pascals.

Figure 7B:
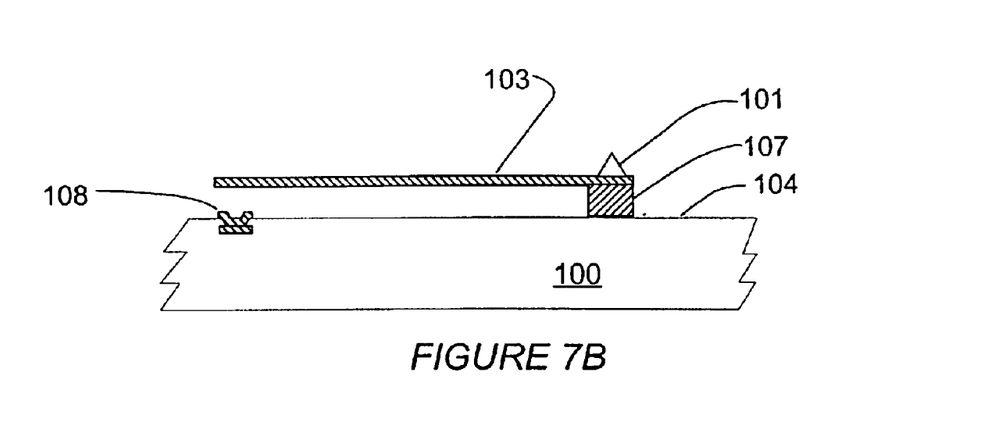
FIG. 7B is a sectional view of the probe at rest.
Figure 7C:
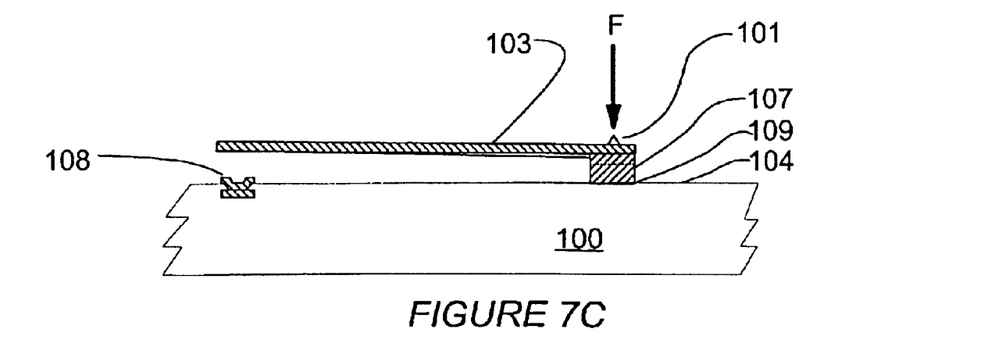
FIG. 7C is a sectional view of the probe when acted upon by force F.

Probe tip 101 shown in FIG. 7A is supported on extension arm 102. The action of arm 102 and probe tip 101 is shown in sectional views of FIGS. 7B and 7C. A force F applied to probe tip 101 exerts a torque on strip 103, twisting the strip 103 between post 105 and slidable pivot 107 and allowing arm 102 to depress toward substrate 104. As seen in the sectional view in FIG. 7C, the vertical motion of probe tip 101 is due to the action of a torsional bending of strip 103.

Probe tip 101 is a pyramid formed by replication of an etch pit formed in a (100) silicon surface by well-known processes. The tip angle of 54.75° is determined by the (111) crystallographic planes in silicon. The material of the tip is tungsten-chromium, which forms a sharp, hard tip that is able to break through aluminum oxide layers on aluminum contact pads typically used on semiconductor IC devices. Materials suitable for making hard probe tips is selected from a group consisting of molybdenum, chromium, nickel, osmium, Paliney 7, rhodium, rhenium, titanium, tungsten, and alloys thereof.

(Fabrication of sharp probe tips by replication of etch pits in silicon is known in the field of electrical contacts and is described in a publication in 1973 by D. A. Kiewit in Reviews of Scientific Instruments, Vol. 44, pages 1741–1742. Kiewit describes formation of probe tips that are made by replication of etch pits in silicon by depositing nickel-boron alloy into the pit, and then removing the silicon matrix material to expose the pyramid. Kiewit formed pyramidal etch pits in silicon (100) surfaces by treating the surface with boiling hydrazine hydrate.)

Strip 103 is supported above substrate 104 by a post 105 that is rigidly joined to contact pad 106 on the substrate 104. Post 105 is formed of an electrodeposited metal, preferably chosen from the group including hard copper, nickel, cupronickel alloys, and hard gold. Electrical connection of probe tip 101 to circuits for testing integrated circuits is made by conduction through arm 102, strip 103, post 105, contact pad 106, and via 108. The electrical circuit from via 108 to probe tip 101 is configured to form as small a loop as possible in order to reduce inductance and thereby allow operation at the highest frequencies or data rates.

Figure 8A:
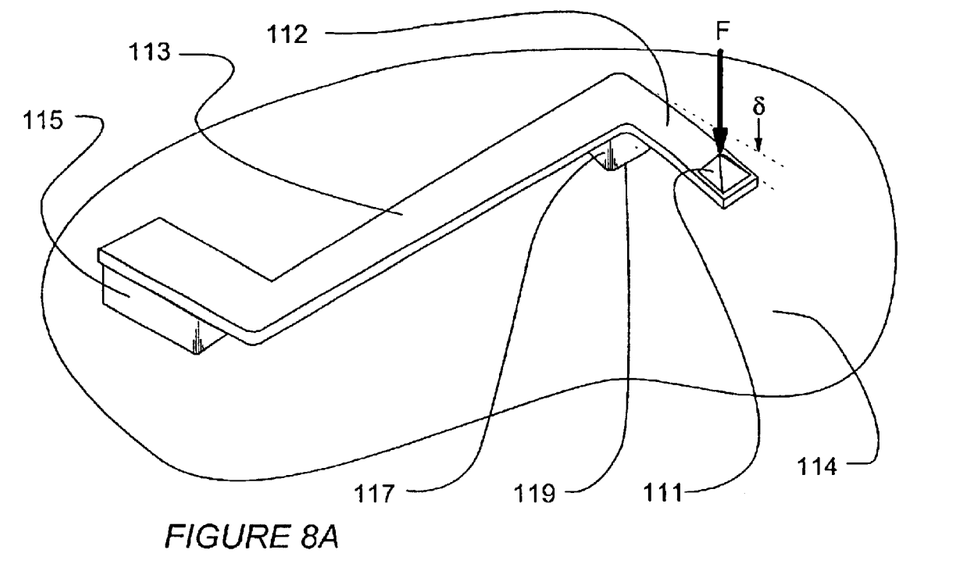
FIG. 8A shows a perspective view the single-sided compliant probe as the probe tip is acted upon by a vertically directed force F.
Figure 8B:
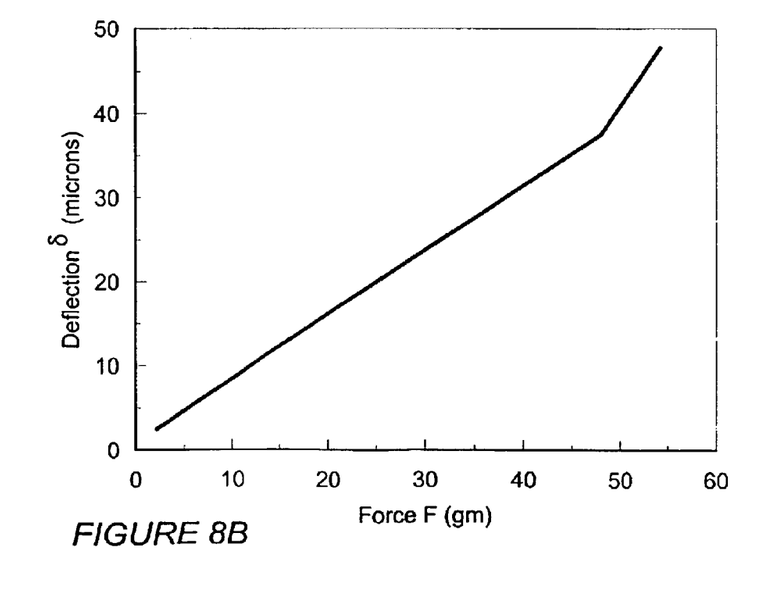
FIG. 8B shows the deflection 6 of the tip of the probe of FIG. 8A as a function of the force F acting on the probe tip.

FIGS. 8A and 8B illustrate in greater detail the operation of the single-ended compliant probe. In this configuration a probe tip 111 is supported by lateral extension arm 112 that is configured at a right angle with respect to main body 113. The main body is supported by rigid post 115 and by pivot post 117. Pivot post 117 is rigidly attached to main body if 3, and is supported on substrate 114 by a sliding contact 119 that allows the post to pivot with respect to the substrate.

As seen in FIG. 8A, a force F depresses probe tip 111 through a deflection of δ in the vertical direction. Extension arm 112 acts as a moment arm that transmits torque to main body 113. The main body is a torsional spring that twists about its axis in response to the torque from extension arm 112. Pivot post 117 supports main body 113 such so as to minimize any cantilever deflection toward substrate 114, while allowing the main body to twist freely about its axis. The main body is a torsional spring that allows compliant motion of tip 111 in response to a force F.

The total deflection δ of tip 111 shown in FIG. 8B is the sum motions due to twisting of the main body 113 and due to cantilever bending of extension arm 112. For this second embodiment, the deflection due to cantilever bending of extension arm 112 is small compared to the deflection due to twisting of main body 113. FIG. 8B shows the total deflection δ in microns caused by a force F in grams acting vertically on probe tip 111. For this study, main body 113 is made of tungsten with a thickness of 50 microns, a width of 62 microns, and a length of 1400 microns. Arm 112 is 250 microns long from the centerline of strip 113 to probe tip 111, as measured in the plane of the strip.

The single-sided compliant probe of this invention allows individual probes to be grouped in closely spaced arrays. Several arrays of probes shown in FIGS. 9A and 9B illustrate the invention as adapted to probe closely spaced rows of contact pads.

Figure 9A:
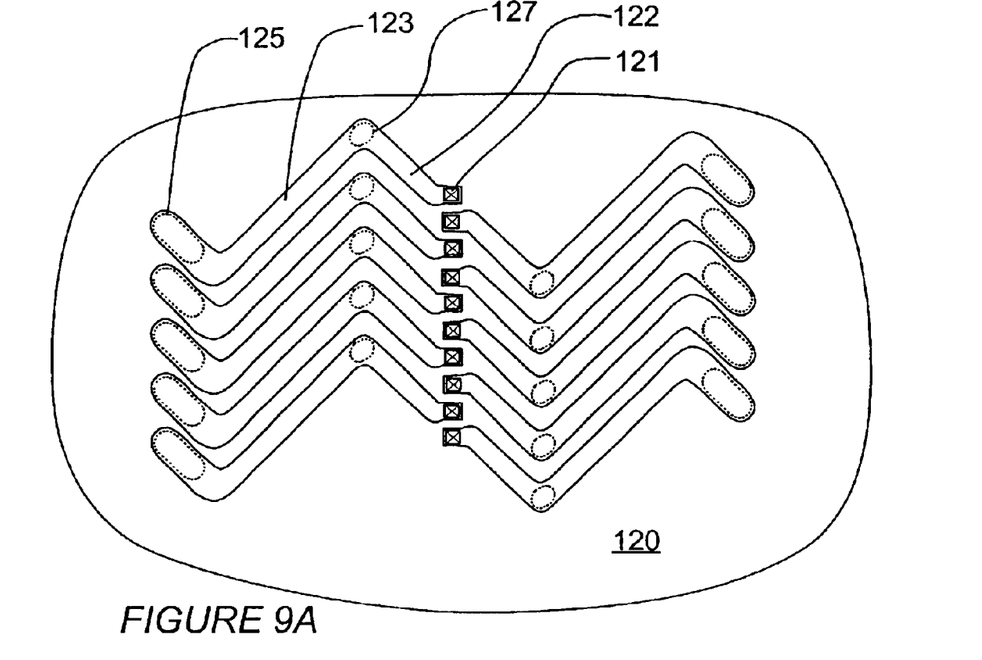
FIG. 9A is a top plan view of n interleaved array of probes and FIG. 9B is a plan view of a linear array of probes.

The probe design of FIG. 9A shows an array 120 of probes each with a main body 123, an extension arm 122 at an angle to the axis of the main body 123, and an elongated post 125 also at an angle to the axis of the main body 123. Each extension arm 122 has a probe tip 121 on the top of the end distant from the main body 123. Each main body 123 is supported by a pivot post 127 located away from the rigid post support 125.

Array 120 of FIG. 9A comprises a cluster of probes arranged in a column on the left side of the array 120, and a similar cluster of probes arranged in a column on the right side of the array 120. The tips on the probes of the column on the right are interleaved with the tips on the probes of the column on the left, forming a row of closely spaced probe tips.

Figure 9B:
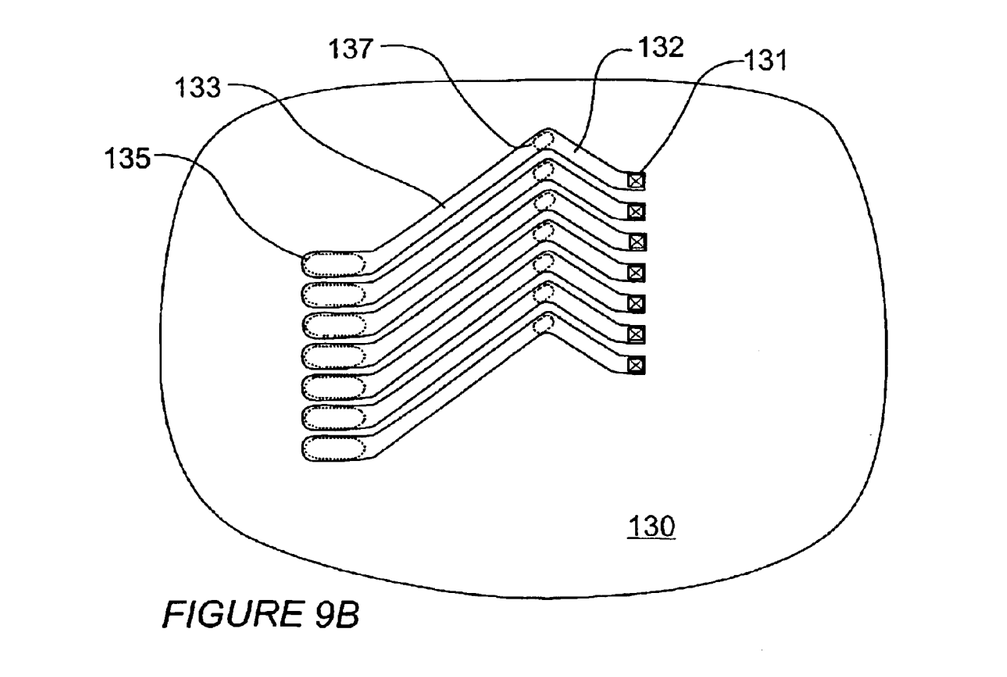

The probe design of FIG. 9B shows an array 130 of probes, each with a main body 133, a moment arm 132 at an oblique angle to the axis of the main body 133, and an elongated post 135 also at an oblique angle to the axis of the main body 133. A probe tip 131 is positioned at the end of each moment arm 132 distant from the main body 133. Each main body 133 is supported by a pivot post 137 located at a distance away from the rigid post support 135.

Array 130 of FIG. 9B comprises a nested column of probes. The oblique angles of moment arm 132 and of rigid post 135 allow a close spacing of the probes, one to another, while maintaining a minimum spacing between adjacent probes. The tips on the probes of the column are arrayed in a row to match the contact pads on the chip to be tested.

Figure 10:
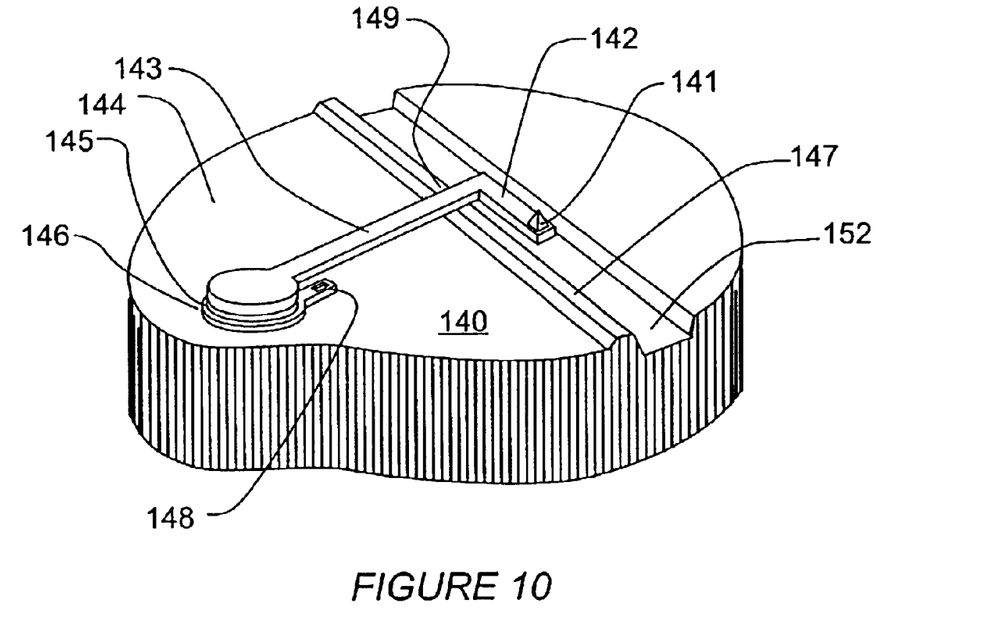
FIG. 10 shows a view of a third embodiment of a single-sided compliant probe with a probe tip located over a void in the substrate holding the probe.
Figure 11:
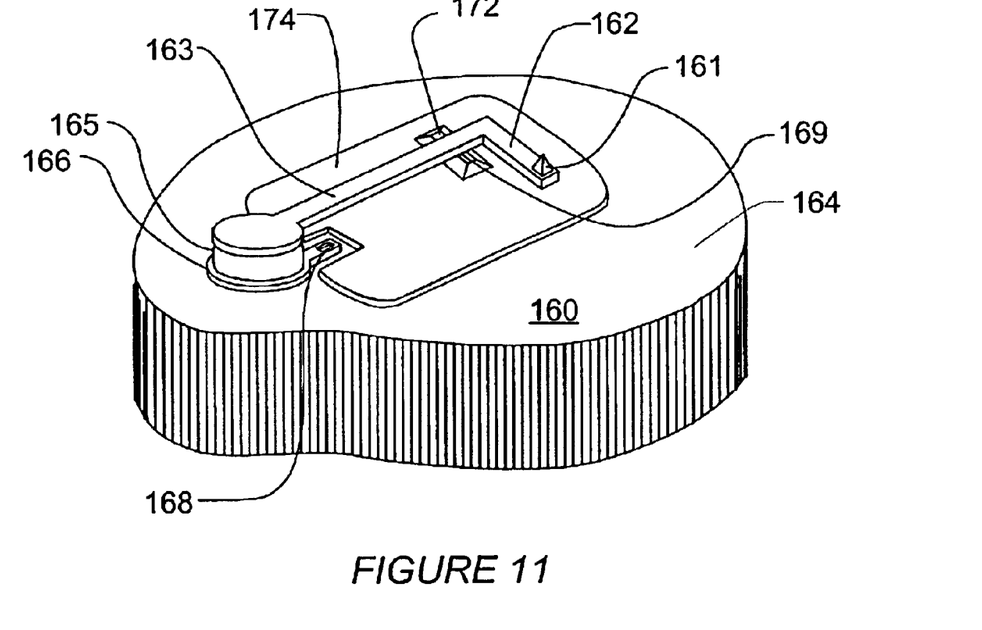
FIG. 11 shows a view of a fourth embodiment of a single-sided compliant probe with an insulating nipple supporting one end of the probe over a ground plane electrical shield.

FIGS. 10 and 11 show additional embodiments of the single-sided compliant probe where a support pivot is affixed to the substrate rather than to the main body of the probe.

A third embodiment 140 is shown in FIG. 10 wherein probe tip 141 is disposed on extension arm 142 that lies above void 152 in substrate 144. In response to an applied force, extension arm 142 and probe tip 141 deflect downward into void 152 without interfering with substrate 144. The main body 143 rests at a slideable support 149 on a ridge 147 on substrate 144 such that main body 143 is free to twist about its axis in response to torque caused by force on probe tip 141.

Electrical connection to probe tip 141 is made through extension arm 142 to the main body 143, which is joined to post 145 that rests on contact pads 146 which in turn is connected to circuits in substrate 144 through via 148.

FIG. 11 shows a fourth embodiment 160 of the single-sided compliant probe, which incorporates a ground plane shield. Protrusion 172 supports main body 163 of the probe on slidable support 169 such that main body 163 is free to twist about its axis by pivoting on slidable support 169. Slidable support 169 is located near the end of the main body opposite the end supported by rigid post 165 so as to limit downward deflection of main body 163 toward substrate 164. In embodiment 160, protrusion 172 is formed from silica to insulate the conductive main body 163 from ground plane 174 located on the surface of substrate 164 under main body 163.

Electrical connection to probe tip 161 is through extension arm 162 to main body 163, in turn connected to rigid post 165 on contact pad 166. Contact pad 166 is connected to circuits in substrate 164 by via 168. The ground layer 174 underlies probe tip 161 and shields the probe electrically in order to achieve higher performance.

Figure 12:
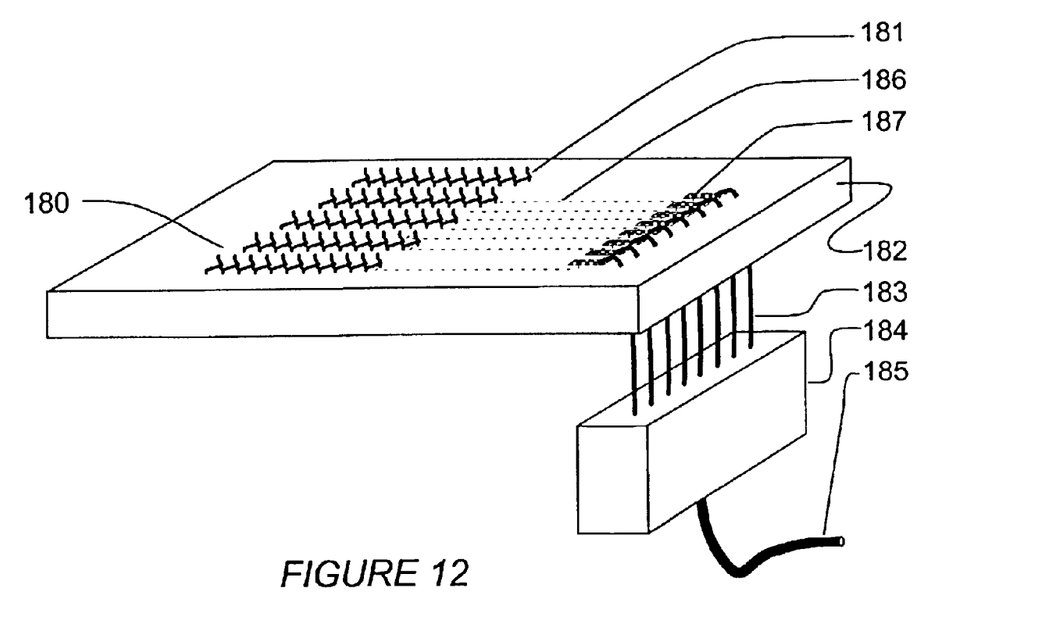
FIG. 12 shows a probe card for testing chips on a semiconductor wafer.

A wafer probe shown in FIG. 12 provides a demountable means for testing and burning-in semiconductor chips on a wafer. Array 180 of probes, arranged on the surface of substrate 182, is configured to be in alignment with contact pads on the chips to be tested. Each probe 181 is electrically connected by conductive traces 186 to circuit means 187 for testing microelectronic devices. Electrical signals suitable for operating semiconductor chips are directed to the socket by interconnection means 183 from electronic test means 184. Cable 185 connects the electronic test means 184 to the system for burn-in, test or operation of the devices under test.

Probe tips shown in FIGS. 13A to 13F are configured for specific applications in test and burn-in microelectronic devices such as semiconductor chips. The designs shown in FIGS. 13A to 13F are representative of probe tips that can be used to make electrical connection to contact pads on microelectronic devices of various types.

Figure 13A:
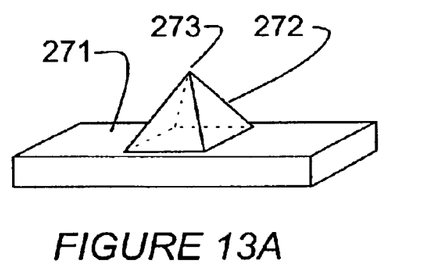
FIGS. 13A to 13F show probe tips for use in single-sided compliant probe structures according to the present invention.

The probe tip shown in FIG. 13A is preferred for probing aluminum bond pads on integrated circuits. Apex 273 is suited to breaking through an oxide layer on aluminum bond pads. Pyramid 272 is formed by replication of an etch pit in a (100) silicon surface. Pyramid 272 is supported on sheet spring 271. Apex 273 of pyramid 272 is defined with an included angle of 54.75° between opposite faces. A hard material is used for probe tip 272, where the material is preferably selected from the group consisting of molybdenum, nickel, osmium, Paliney 7, rhodium, rhenium, titanium, tungsten, and their alloys. In probing soft contacts, materials such as osmium, rhodium, and tungsten are preferred because they react slowly with solders and other soft materials.

Figure 13B:
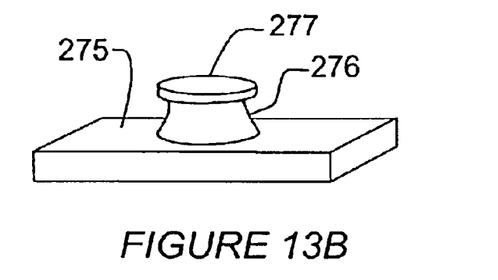

The probe tip shown in FIG. 13B is suited for contacting noble metal contact pads. Thin disk 277 is supported on metal post 276 disposed on sheet spring 275. Post 276 is undercut by chemical etching to expose edges of disk 277. Thin disk 277 is made of an inert metal preferably selected from the group consisting of gold, Paliney 7, Platinum, Rhodium, and their alloys.

Figure 13C:
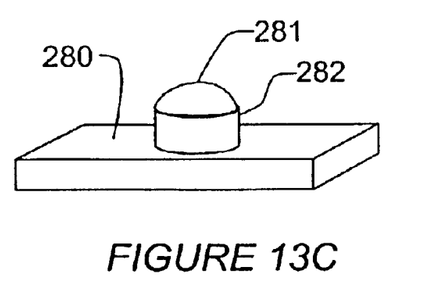

The probe tip shown in FIG. 13C is suited to contacting solder and other soft materials. Rounded metal tip 281 is supported on metal post 282 that is disposed on sheet spring 280. Rounded metal tip 281 can be shaped by flash laser melting a high temperature material to reflow into the shape of a spherical section. Materials suitable for rounded metal tip 281 include nickel, platinum, rhodium, cupro-nickel alloys, beryllium-copper alloys, and Paliney 7.

Figure 13D:
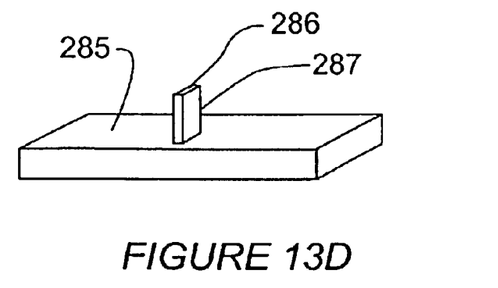

The probe tip shown in FIG. 13D is suited to contacting small contact pads and pads that are spaced closely together. Probe tip 287 with top edge 286 is disposed on the top surface of sheet spring 285. Probe tip 287 can be formed by plating the edge of a sacrificial material and then removing that material to leave a thin sheet of metal 287 projecting vertically from sheet spring 285.

Figure 13E:
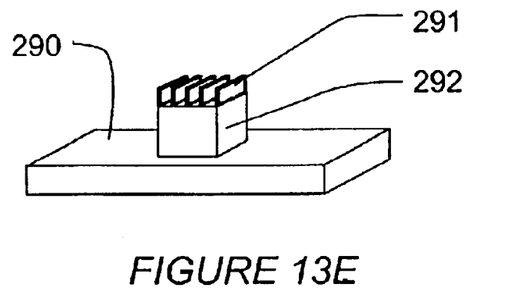

The probe tip shown in FIG. 13E is suited for making contact to oxidized contact pads, where a wiping motion is used to break through the oxide layer. Metal fins 291 are oriented in the direction of wipe so as to slide along the contact pad and to break through the oxide layer. Metal fins 291 are arrayed on the top of conductive pedestal 292, which rests on probe structure 290. The metal fins are fabricated by metal coating the vertical edges of grooves in resist material, and then removing the resist to leave metal fins 291 standing on edge.

Figure 13F:
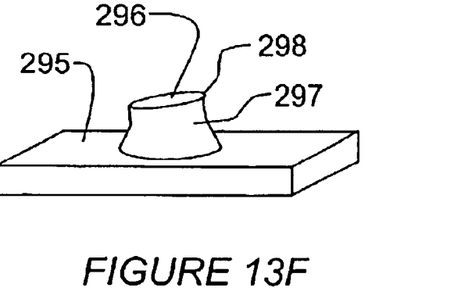

The probe tip shown in FIG. 13F is suited to contacting small contact pads. Cylindrical post 297 has top flat surface 296 that is oriented at an oblique angle with respect to the top surface of probe structure 295 so as to form cutting edge 298 with an acute included angle. When actuated by a wiping motion, cutting edge 298 removes oxides and other contaminants from the surface of contact pads being tested.

Although several specific embodiments of the invention have been described, numerous modifications and alternatives thereto would be apparent to one having ordinary skill in the art without departing from the spirit and scope of the invention. Therefore, it is not intended that this invention be limited, except as indicated by the appended claims.

What is claimed is:

1. A probe for making electrical connection to contact pads on microelectronic devices, said probe comprising:

(a) a conductive main body forming a torsional spring along a long axis and having a first and a second end;

(b) a rigid substrate with a surface;

(c) a single rigid electrically conductive post supporting said first end of said main body away from said surface of said substrate;

(d) an arm extending distally from said second end of said main body atone an axis offset laterally from the lone axis of the main body and generally parallel to the substrate;

(e) support means, said support moans being near said second end and disposed at said surface of said substrate, said support means providing a pivot point for said arm relative to said main body; and (f) an electrically conductive tip structure with a base disposed on said arm, wherein a displacement of said tip structure toward said substrate causes twisting of a substantially straight elongate portion or said main body as torsional distortion about the long axis.

2. The probe of claim 1, wherein said support moans is disposed at said second end of said main body.

3. The probe of claim 1, wherein said support means is a protrusion on said main body, said protrusion being in slidable contact with amid top surface of said substrate.

4. The probe of claim 1, wherein said support means is a protrusion on said substrate, said protrusion being in slidable contact near said second end.

5. The probe of claim 1, wherein said support means is disposed on said arm.

6. The probe of claim 1, wherein said tip structure comprises a pyramid.

7. The probe of claim 1, wherein said support means comprises a poet.

8. The probe of claim 1, wherein said tip structure comprises a cylindrical metal projection from said arm.

9. The probe of claim 1, wherein said tip structure comprises at least one platelet oriented in a piano parallel to direction of slidable motion.

10. The probe of claim 1 further including an elastic dielectric material disposed between said main body and said surface of said substrate.

11. A probe for making electrical connection to contacts on microelectronic circuits, said probe comprising:
  (a) a rigid substrate;
  (b) an elongate torsion spring having a long axis along a substantially straight main body portion between a first end and second end;
  (c) a first rigid pout supporting said spring at a first end off said substrate;
  (d) an arm extending laterally from second end of said spring to a distal end along an axis offset laterally from the boa axis of the torsional spring and generally parallel to the substrate;
  (e) pivot support means supporting said spring, said support means being near said second end, said support means providing a pivot point for said aim; and
  (f) a probe tip disposed at said distal end of said aim such that a force applied transverse to said arm to said probe tip causes torsional flexing of said spring about its long axis.

12. The probe of claim 11 wherein said spring is formed of a planar sheet of metal.

13. The probe of claim 11 wherein said first post comprise, a first metal post and said pivot support means comprises a pivot post providing slidable contact with said substrate.

14. A probe for making electrical connections to contact pads on a microelectronic device, said probe comprising:
  (a) a rigid substrate;
  (b) a strip of electrically conductive material with a first end and a second end and a substantially straight elongate body portion between said first cod and said second end, said strip disposed above said rigid substrate and acting as a torsional spring and having a long axis;
  (c) a rigid support at said first end and a pivot support at said second end of said strip;
  (d) an arm of said strip extending from said second end in a direction laterally to said long axis between said first end of said strip and said second end of said strip and being generally parallel to said rigid substrate;
  (e) an electrically conductive tip disposed on a distal end of said arm;
  (f) whereby a mechanical force on said conductive tip toward said rigid substrate is operative to cause said elongate body portion of said strip to twist about said long axis in torsional flexure of said strip such that deflection of said tip is primarily a result of said torsional flexure.

* * * * *